United States Patent [19]

Kumar

[11] Patent Number: 5,120,572
[45] Date of Patent: Jun. 9, 1992

[54] METHOD OF FABRICATING ELECTRICAL COMPONENTS IN HIGH DENSITY SUBSTRATES

[75] Inventor: Nalin Kumar, Austin, Tex.

[73] Assignee: Microelectronics and Computer Technology Corporation, Austin, Tex.

[21] Appl. No.: 605,806

[22] Filed: Oct. 30, 1990

[51] Int. Cl.⁵ .......................................... H01L 21/70
[52] U.S. Cl. ........................................ 437/60; 437/918; 437/919; 148/DIG. 14; 148/DIG. 136
[58] Field of Search .................... 437/60, 918, 919; 148/DIG. 14, DIG. 136

[56] References Cited

U.S. PATENT DOCUMENTS

| | | | |
|---|---|---|---|
| 3,113,253 | 12/1963 | Ishikawa et al. | 361/313 |
| 3,257,592 | 6/1966 | Maissel | 317/258 |
| 3,603,850 | 9/1971 | Kirschner . | |
| 3,710,201 | 1/1973 | Ikeda . | |
| 3,745,430 | 7/1973 | Linquist et al. | 361/306 |
| 3,778,689 | 12/1973 | Bodway . | |
| 3,864,817 | 2/1975 | Lapham, Jr. et al. | 437/918 |
| 3,882,059 | 5/1975 | Elderbaum . | |
| 4,025,829 | 5/1977 | Makihara | 29/25.42 |
| 4,074,340 | 2/1978 | Leigh . | |
| 4,136,291 | 1/1979 | Waldron . | |
| 4,153,988 | 5/1979 | Doo | 29/827 |
| 4,190,854 | 2/1980 | Redfern | 357/51 |
| 4,238,762 | 12/1980 | McWilliams et al. . | |
| 4,342,069 | 7/1982 | Link | 361/401 |
| 4,347,650 | 9/1982 | McLarney et al. . | |
| 4,349,862 | 9/1982 | Bajorek et al. | 361/401 |
| 4,393,438 | 7/1983 | Schelhorn | 361/401 |
| 4,401,843 | 8/1983 | Harper et al. | 361/306 |
| 4,471,406 | 9/1984 | Sawairi . | |
| 4,476,518 | 10/1984 | Tsukahara . | |
| 4,498,121 | 2/1985 | Breedis et al. | 361/401 |
| 4,527,180 | 7/1985 | Oto . | |
| 4,539,622 | 9/1985 | Akasaki | 361/401 |
| 4,544,989 | 10/1985 | Nakaku et al. | 361/401 |
| 4,561,039 | 12/1985 | Tshuahara . | |
| 4,705,917 | 11/1987 | Gates, Jr. et al. | 174/52 |
| 4,730,241 | 3/1988 | Takaya | 363/19 |
| 4,744,008 | 5/1988 | Black et al. | 361/386 |
| 4,789,645 | 12/1988 | Calviello et al. | 437/919 |
| 4,802,062 | 1/1989 | Blum et al. | 361/401 |
| 4,810,332 | 3/1989 | Pan | 204/15 |
| 4,816,967 | 3/1989 | Landis | 361/401 |
| 4,827,377 | 5/1989 | Butt | 361/401 |
| 4,874,493 | 10/1989 | Pan | 204/191 |
| 4,876,176 | 10/1989 | Calviello et al. | 437/919 |
| 4,890,192 | 12/1989 | Smith | 361/313 |
| 4,904,340 | 2/1990 | Miracky et al. | 156/643 |
| 4,920,639 | 5/1990 | Yee | 20/846 |

FOREIGN PATENT DOCUMENTS 0098671 1/1984 European Pat. Off. .

OTHER PUBLICATIONS

IBM Technical Disclosure Bulletin, vol. 9, Mar. 1967, p. 1266, N.Y., US; A. S. Farber.
IBM Technical Disclosure Bulletin, vol. 25, No. 11A, Apr. 1983, p. 5545, N.Y.; US; Dove et al.
Bartlett et al, "Multi-Chip Packaging Design for VLSi--Based Systems", IEEE ECC, Boston, May 1987, pp. 518-525.
Bertram J., "High-Density Large Scale Interconenction for Improved VLSI System Performance", IEDM Technical Digest, pp. 100-103, Dec. 6-9 1987.

Primary Examiner—Brian E. Hearn
Assistant Examiner—Tuan Nguyen
Attorney, Agent, or Firm—David M. Sigmond

[57] ABSTRACT

A process for fabricating integrated resistors in high density interconnect substrates for multi-chip modules. In addition, the resistor material can be connected selectively into an insulator for optionally allowing for the simultaneous fabrication of integrated resistors and capacitors in relatively few steps. The process is well suited for cooper/polyimide substrates.

16 Claims, 10 Drawing Sheets

METHOD OF FABRICATING ELECTRICAL COMPONENTS IN HIGH DENSITY SUBSTRATES

BACKGROUND OF THE INVENTION

The present invention relates to a process for fabricating integrated resistors or simultaneously fabricating both integrated resistors and capacitors in a high density interconnect substrate, preferably made from copper/polyimide technology.

As the performance levels required from state of the art multi-chip modules (MCM) are increasing, several additions and enhancements must be made. In these MCM's a high density multi-layer interconnect (HDMI) substrate is used to interconnect a large number of integrated circuits. Increasing the operating frequency of the MCM's is a desired goal. However, in these modules an electrical signal travelling along a low loss copper line produces a reflected wave which interferes with the incident signal wave causing standing waves, signal distortion, and creation of spurious signals unless all lines are properly terminated with resistors equal to the characteristic impedance of the line. At the same time, decoupling capacitors are required in MCM's for power regulation during high speed signal switching. Therefore, both termination resistors and decoupling capacitors, either integrated or surface mounted, will be required. An advantage of integrated components is that there is little or no loss of interconnect density.

SUMMARY

The present invention is directed to a process for fabricating integrated resistors and both integrated resistors and capacitors in a high density interconnect substrate. In one embodiment the termination resistor material can be converted selectively into a dielectric to provide integrated resistors and capacitors with a minimum number of process steps. And preferably, the integrated resistors and capacitors are fabricated in substrates made from copper/polyimide technology.

A further object of the present invention is a method of making integrated resistors in a substrate comprising applying a resistive layer over an underlying substrate, applying a first mask over selected portions of the layer but leaving a portion of the resistive layer uncovered and etching away the uncovered portions and removing the mask. The method further includes applying in series upwardly a optional electrically conductive lower adhesive, a first electrically conductive layer, an upper adhesive layer, and an electrically nonconductive layer over the resistive layer, and applying a second mask over selected portions of the resistive layer leaving exposed portions for electrical connections. The method then includes etching the nonconductive layer and the upper adhesive layer from the exposed portions and plating conductive electrical connections in the exposed portions to the first conductive layer. Thereafter, the second mask is removed and, if desired, an electrically conductive protective coating can be applied to the electrical connections and any conductive layer. The first electrically conductive, upper adhesive, nonconductive, and any lower adhesive layers are removed, leaving only the resistive layer and the electrical connections on the substrate, and thereafter applying a coat of polymer thereon. Preferably, the method includes applying a layer of polyimide up to the top of the electrical connections.

Yet a still further object of the present invention is the method of simultaneously making an integrated resistor and capacitor in a substrate which includes applying a resistive layer over an underlying substrate and applying a conductive layer over the resistive layer, applying a first mask for defining the resistor and a bottom electrode leaving other portions of the layers uncovered, and etching away the uncovered portions of the conductive and resistive layer to form a resistor and a bottom electrode, and removing the first mask after pattern transfer. A second mask is applied covering the resistor, but leaving a portion of the conductive layer over the bottom electrode uncovered, etching the uncovered conductive layer, removing the second mask, and oxidizing the top of the bottom electrode to form an insulator for the capacitor using the unetched conductive layer as a mask. The method includes applying a third mask leaving a portion of the insulator uncovered, applying a second conductive layer to the insulator forming an upper electrode of the capacitor, and removing the third mask. Thereafter, a fourth mask is applied leaving openings for vias from the resistor and the electrodes and applying conductive via pillars in the openings to the resistor and the electrode. The method then includes stripping the fourth mask and stripping the each conductive layer between the vias down to the resistive layer.

A still further object of the present invention is wherein the second mask is used as the third mask reducing the number of required steps.

A still further object of the present invention is where in the step of etching the uncovered conductive layer, the conductive layer is etched back from the second mask for insuring that the upper electrode is adequately separated from the lower electrode.

An advantage of the present invention is the fabrication of resistors and capacitors in a structure in relatively few steps.

Other and further objects, features and advantages will be apparent from the following description of the presently preferred embodiments of the invention, given for the purpose of disclosure, and taken in conjunction with the accompanying drawings.

DESCRIPTION OF THE PREFERRED EMBODIMENTS

Figure 1:
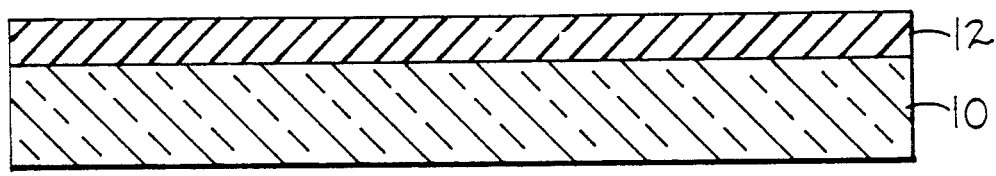
FIGS. 1 through 14 are schematic cross-sectional views illustrating in sequence the method of fabricating an integrated resistor.

Referring now to the drawings, and particularly to FIG. 1, the reference numeral 10 generally indicates a substrate which may be of any suitable material so long as it is of a high enough resistance so as not to short an applied resistor. The substrate may be made of silicon, alumina, sapphire, aluminum nitride, silicon carbide or boron nitride. In fact, the substrate 10 could be made of a conducting metal material such as aluminum, copper, molybdenum, Cu/Mo/Cu, or copper cladded invar. In this case, a thin layer of an insulating material must be applied to the metal substrate which could be organic, such as polyimide, or inorganic, such as aluminum nitride, diamond or aluminum oxide. These materials allow heat generated from the resistors to be efficiently removed from the substrate.

In FIG. 1, a thin film of a resistor material 12 (i.e. resistive in the range of 10–100 $\mu\Omega$-cm) is applied to the substrate 10. Preferably, the resistor material 12 is tantalum nitride (TaN) which may be applied such as by sputter deposition of a thin film (1,000–10,000 angstroms thick). However, the resistor material can be nichrome (nickel-chromium alloy), titanium nitride, molybdenum or any other material with a sufficiently high resistivity.

Figure 2:
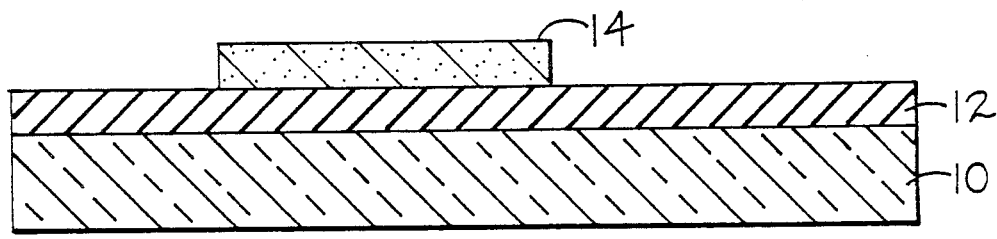
Figure 3:
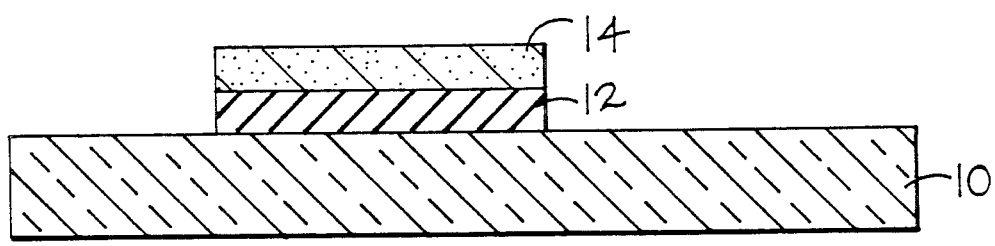
Figure 4:
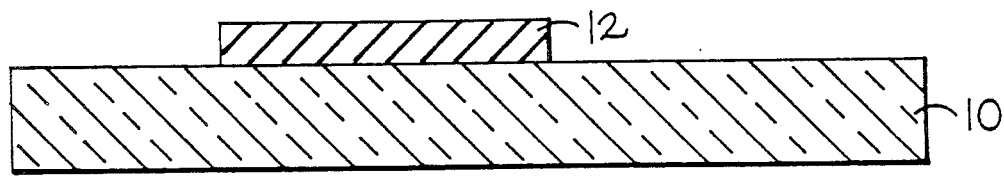

The resistor layer 12 is patterned and etched into individual resistors, here shown as one in FIG. 2, using standard photo-lithography etching (either dry or wet) techniques, here shown as applying a photoresist mask 14 over selected portions of the resistive layer 12 but leaving a portion of the resistive TaN layer 12 uncovered. In FIG. 3, the uncovered portions of the resistive layer 12 are etched away such as by reactive ion etching in either $CF_4+O_2$ or $SF_6+O_2$ gases. In FIG. 4, the photoresist mask 14 has been conventionally removed leaving a portion of the resistor layer 12 forming a resistor on the substrate 10.

Figure 5:
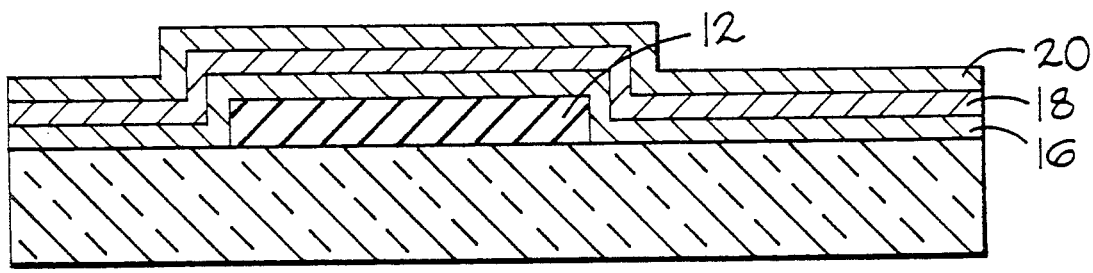

Referring now to FIG. 5, a plating interconnect consisting of layers 16, 18 and 20 is deposited on the surface of the substrate 10. In the preferred embodiment, a sputter deposition of 700 angstroms of chromium form layer 16, 2500 angstroms of copper form layer 18, and 500 angstroms of titanium form layer 20. The bottom layer 16 is used as an electrically conductive lower adhesion layer for the copper layer 18 and the top layer 20 is a protective coat for copper layer 18 as well as an adhesive layer for the following steps. Other suitable plating interconnects may consist of different materials. The use of different materials may provide for a first electrically conductive layer 18 that adheres well to a resistive layer 12, thereby obviating the need for lower adhesion layer 16.

Figure 6:
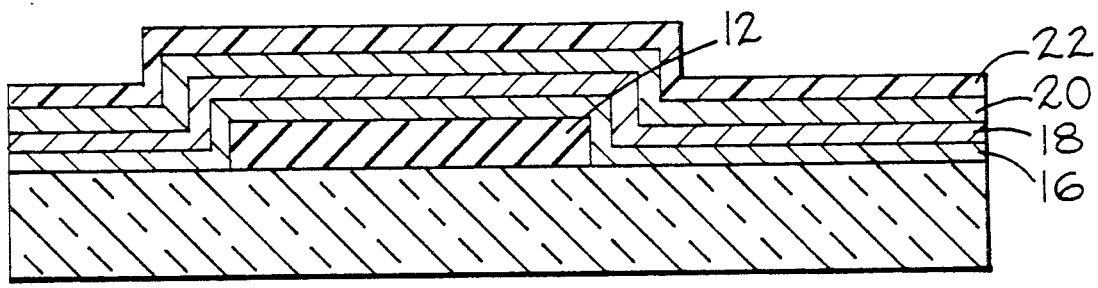

Referring now to FIG. 6, a thin sacrificial non-electrically conductive layer such as a polyimide layer 22 is applied such as by spin coating on the substrate 10 over the layer 20.

Figure 7:
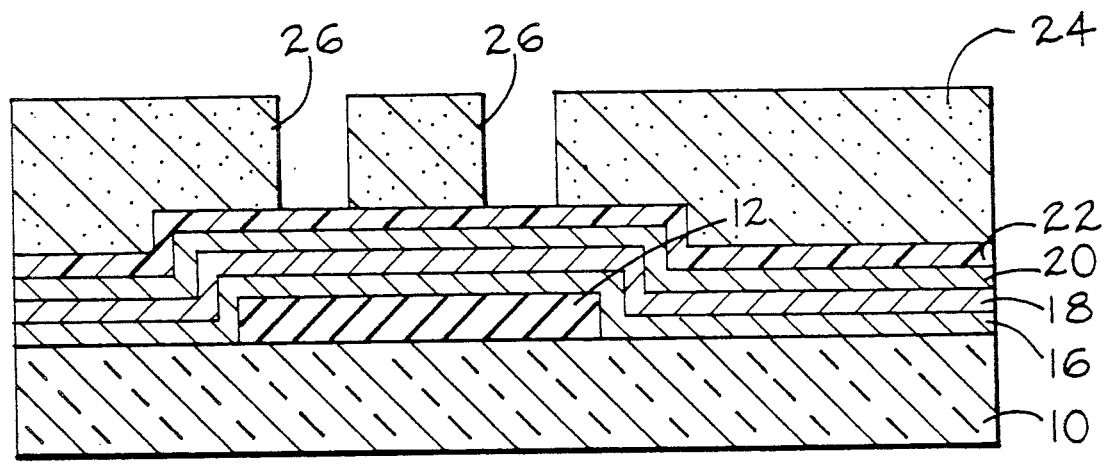
Figure 8:
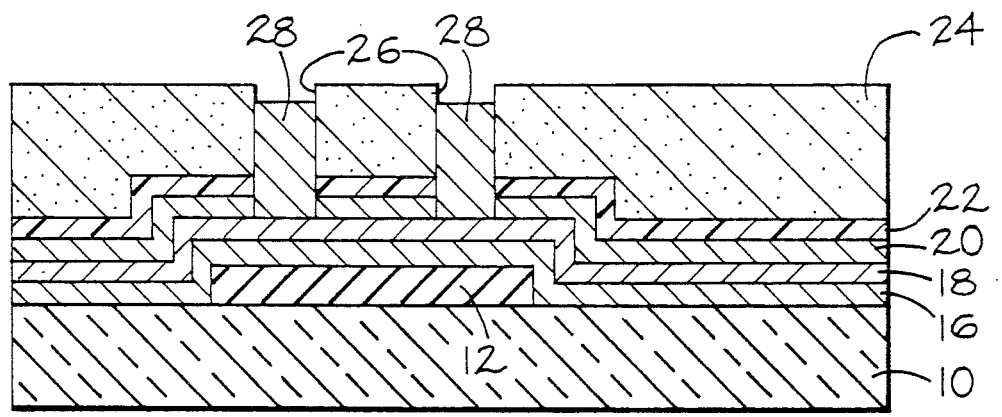

In FIG. 7, a second mask 24 of 25 microns photopolymer is applied over selected portions of resistive layer 12, but leaving exposed portions for fabricating electrical connections. Also in FIG. 7, the mask 24 is used for dry etching the polyimide 22 in the exposed portions 26 as well as the thin top titanium layer 20 in the portions 26. (Of course, the polyimide layer 22 and the titanium layer 20 beneath the mask 24 remain.) The titanium layer 20 may be stripped in a mild solution such as 0.5% hydrofluoric solution. This forms a pattern for electrical connections, such as 5–20 microns of copper 28, to be electroplated to the copper layer 18 as best seen in FIG. 8. Copper 28 can also be deposited by electroless plating.

Figure 9:
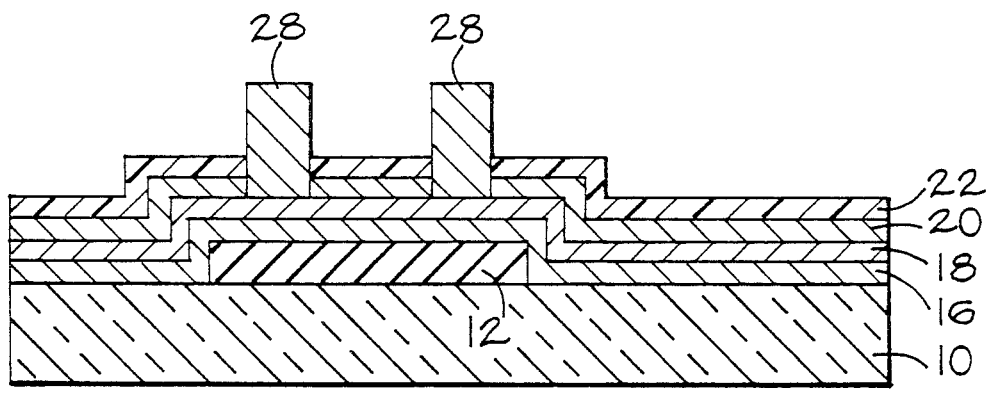

In FIG. 9, the resist mask 24 has been stripped.

Figure 10:
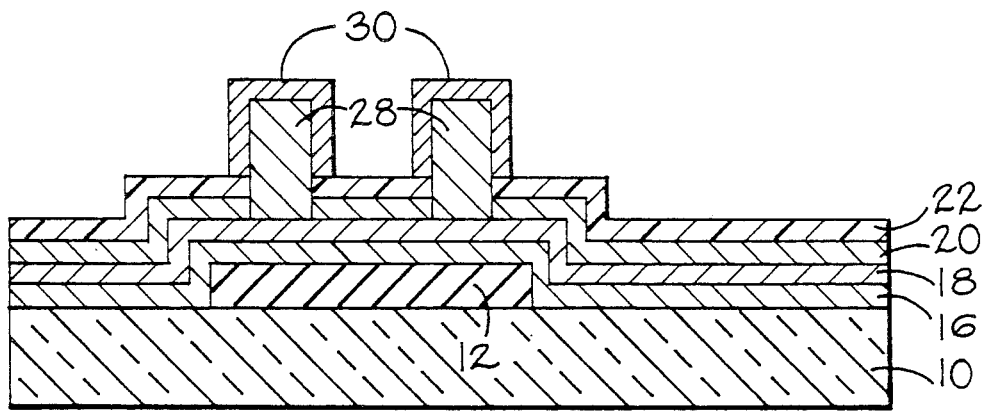

In FIG. 10, a thin protective conductive electrical coating, such as a 0.5–1.0 micron layer of nickel 30 may be electroplated on the copper connections 28 for protecting them against corrosion and diffusion into a following polyimide coating. While protective layer 30 is preferred it is optional.

Figure 11:
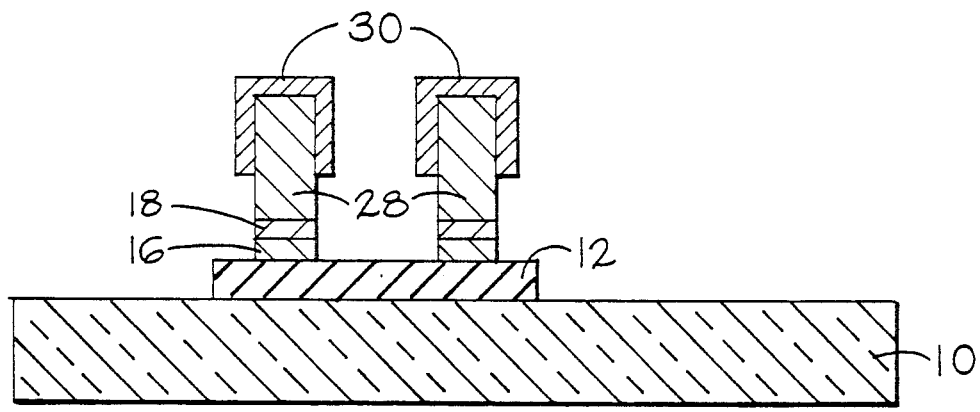

In FIG. 11, the polyimide layer 22 has been stripped, and the layers 20, 18 and 16 have been etched (which are outside of the electrical connections 28 and protective nickel overcoat 30). The titanium can be etched by a hydrofluoric solution, the copper may be stripped by an ammonium persulfate-phosphoric acid solution and the chromium may be etched by ferricyanide+sodium hydroxide solution. This leaves only the resistor 12 with the electrical connections of the copper pillars 28 coated with a coating of nickel 30.

Figure 12:
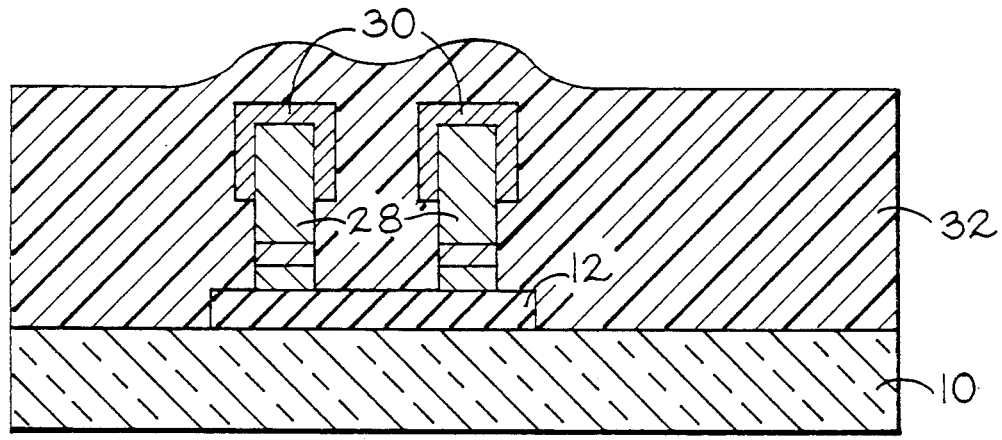
Figure 13:
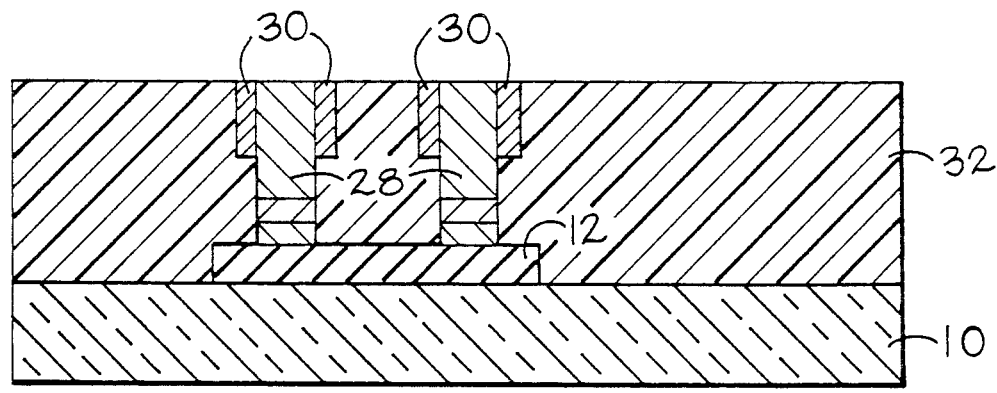
Figure 14:
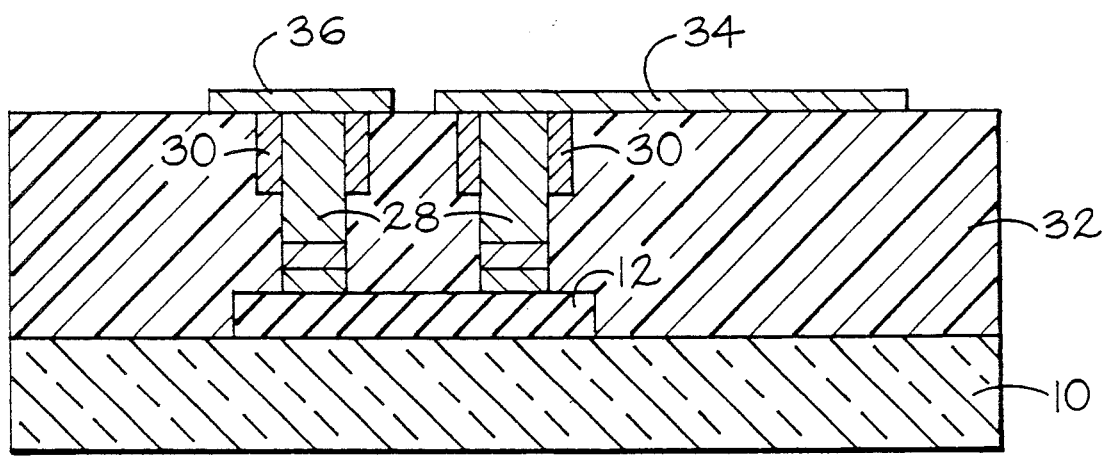

In FIG. 12, a thick dielectric layer is applied over the substrate. As shown a suitable polymer like polyimide layer 32 is spun on the substrate 10 and as best shown in FIG. 13, the tops of the copper pillars 28 are exposed such as by mechanically polishing the top of polyimide 32. As best seen in FIG. 14, the copper pillars 28 are used for making electrical connections 34 and 36 between the resistor 12 and upper layers of interconnects.

Referring now to FIGS. 15–30, the method of fabricating both resistors and capacitors on a substrate is illustrated. While for the purposes of illustration the fabrication of both resistors and capacitors will be described, it is understood that the present invention for building capacitors and resistors on a substrate in FIGS. 15–30 can also be used, if desired, to build merely resistors or merely capacitors in a substrate. In some applications it may be preferable to employ close-attached capacitors and/or resistors instead of integrating the capacitors and/or resistors into the substrate.

Figure 15:
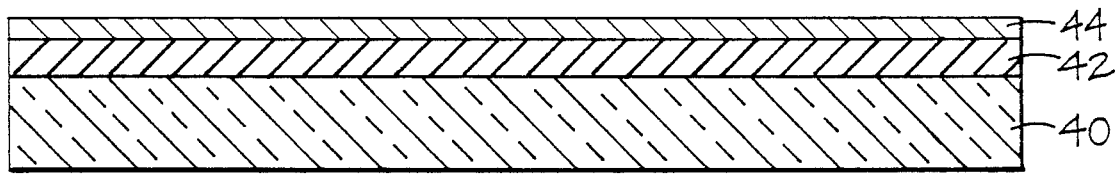
FIGS. 15 through 30 are schematic cross-sectional views illustrating in sequence the method of fabricating both integrated resistors and capacitors.
Figure 16:
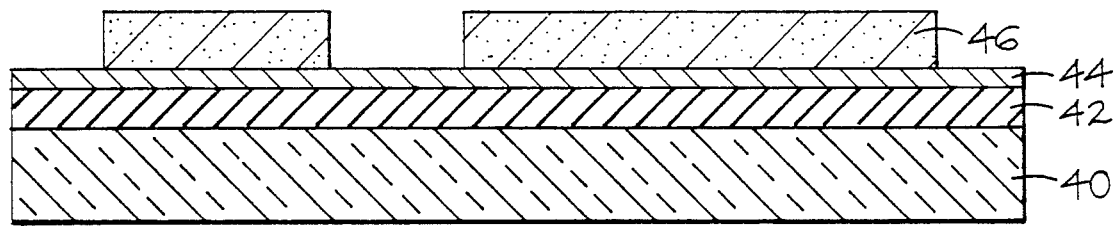
Figure 17:
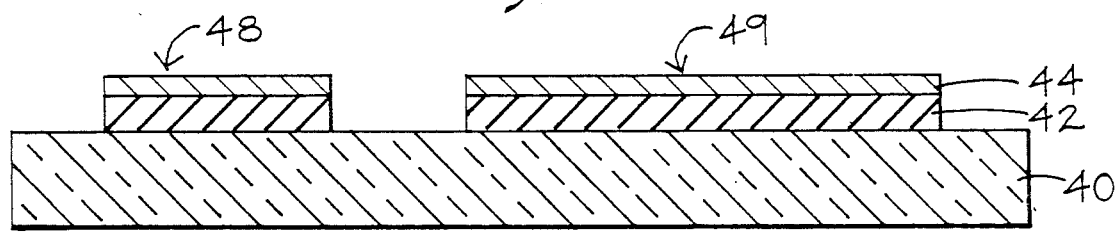

Referring now to FIG. 15, a substrate 40 is shown which may be of any type similar to those described in connection with substrate 10, and a resistive layer 42 is applied thereon, such as by sputter depositing 3000 angstroms of tantalum nitride (TaN). Resistive layer 42 is a material which is resistive but not insulating, for instance in the range of 10–100 $\mu\Omega$-cm. A conductive layer 44 is then applied on top of the resistive layer 42 such as by sputter depositing 1,000 angstroms of titanium. In FIG. 16 a conventional photoresist mask 46 is applied on the layer 44 for defining a resistor and a bottom electrode of the capacitor by leaving other portions of the layers 42 and 44 uncovered. Thereafter, as seen in FIG. 17, the method includes etching away the uncovered portions of the conductive layer 44 and the resistive layer 42 to form a resistor 48 and a bottom electrode 49. The mask 46 is then removed.

Figure 18:
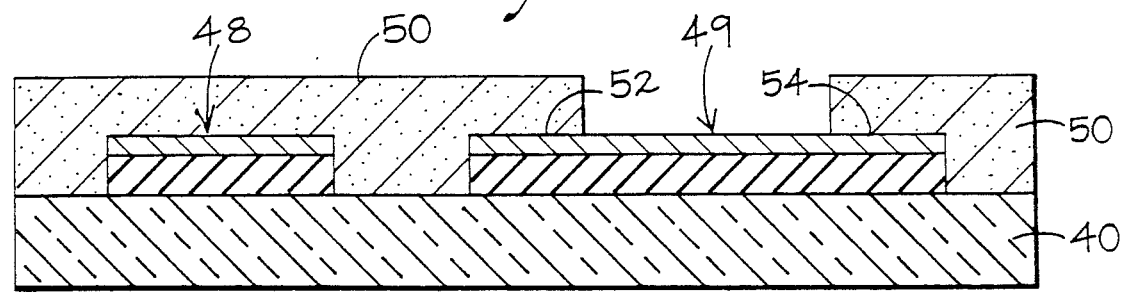

As best seen in FIG. 18, a second photoresist mask 50 is applied covering the resistor 48 but leaving a portion of the conductive titanium layer 44 uncovered, and particularly, it is to be noted that the ends 52 and 54 of the titanium layer 44 are covered for reasons which will be more fully discussed hereinafter.

Figure 19:
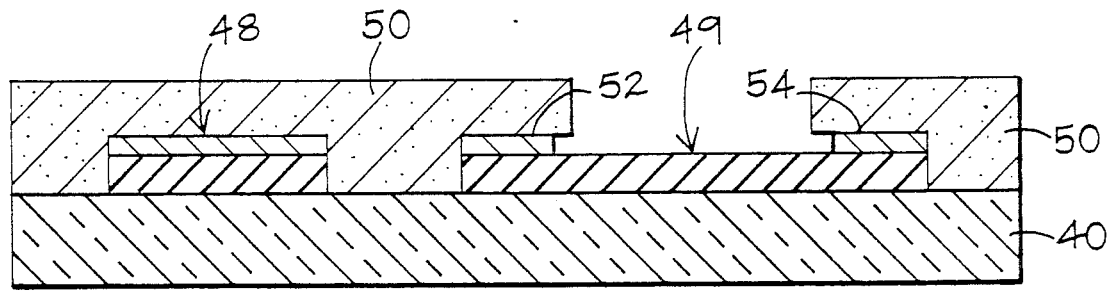

Referring now to FIG. 19, the uncovered portion of the titanium or conductive layer 44 is wet etched such as by hydrofluoric acid solution. In fact, as best seen in FIG. 19, the titanium layer 44 is wet etched to undercut the mask 50 at each of the ends 52 and 54 by as much as 100 microns. The reason for this undercut, as will be more fully described, is to reuse the mask 50, if desired, and provide a smaller width upper capacitor electrode for providing an electrically stable capacitor.

Figure 20:
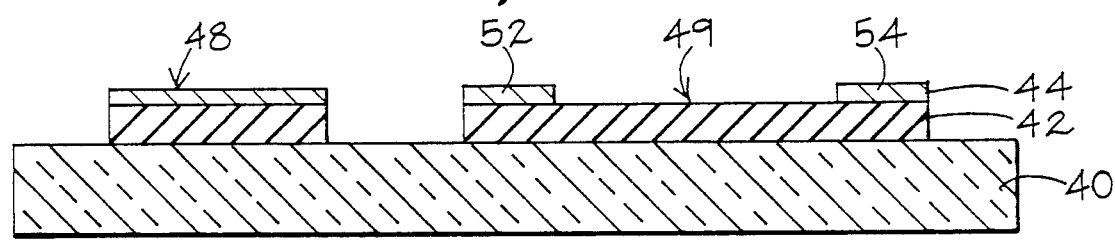
Figure 21:
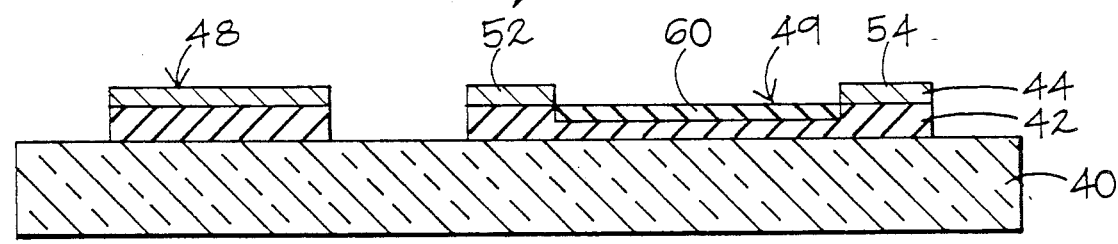
Figure 22:
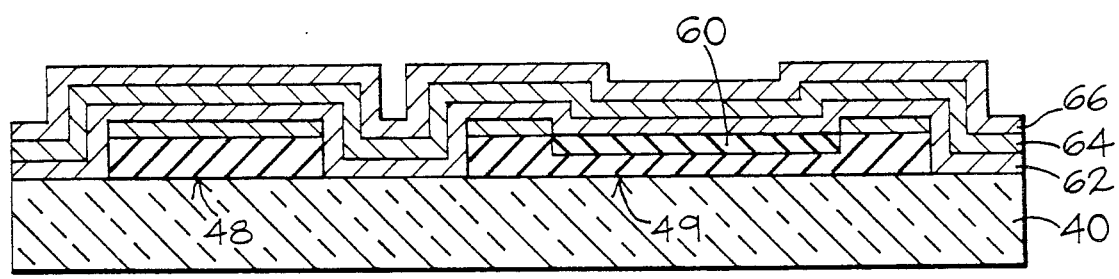

Referring now to FIG. 20, the photoresist mask 50 of FIG. 19 has been removed. In FIG. 21, the conductive layer of titanium, which now consists of ends 52 and 54, is used as a hard mask for oxidizing the top of the resistive layer 42 in order to provide a dielectric insulator on top of the lower electrode 49 of the capacitor. Oxidizing the layer 42 can be done by oxygen ion bombardment, ion implantation, annealing, RTP in a furnace, or by anodizing. Oxygen ion bombardment is the preferred method. In the present example the substrate is subjected to oxygen ion bombardment using a Kaufman type ion source with 500–1000 electron volts at 10 milliamps for a few minutes. This can produce 500–1000 angstroms of a $Ta(O)_n(N)_y$ insulator 60 from resistive layer 42. As best seen in FIG. 22, a plating interconnect may be provided consisting of layers 62, 64 and 66. These layers may be provided by sputtering or evaporating tri-layers of Ti/Cu/Ti or Cr/Cu/Ti on top of the structure of FIG. 21. Lower electrically conductive adhesion layer 62 may not be necessary if layer 64 will adhere to the underlying materials.

Figure 23:
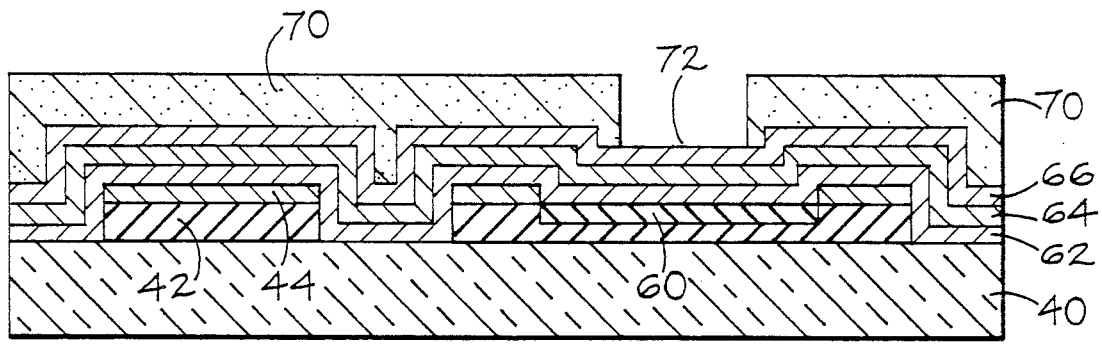
Figure 24:
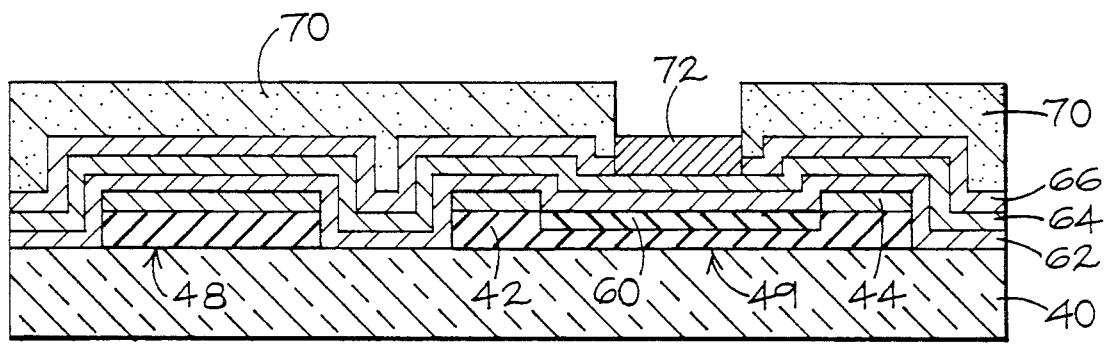

Referring now to FIG. 23, a third mask 70 of photoresist is applied upon the structure therein. Preferably, the same mask 50 used in FIGS. 18 and 19 is reapplied in FIG. 23 as this mask provides an area on top of the interconnect layers 62, 64 and 66 having a width less than the width of the insulator or dielectric layer 60. Thus, as best seen in FIG. 24, the top layer 66 is etched away for allowing the electrode plating of a second conductive layer 72 which may be either copper or nickel. For example, the upper electrode 72 may be one micron thick nickel. It is noted that the width of the upper electrode 72 is less than the width of the insulator 60 thereby spacing the edges of the upper electrode 72 further away from the edges of the lower electrode 49.

Figure 25:
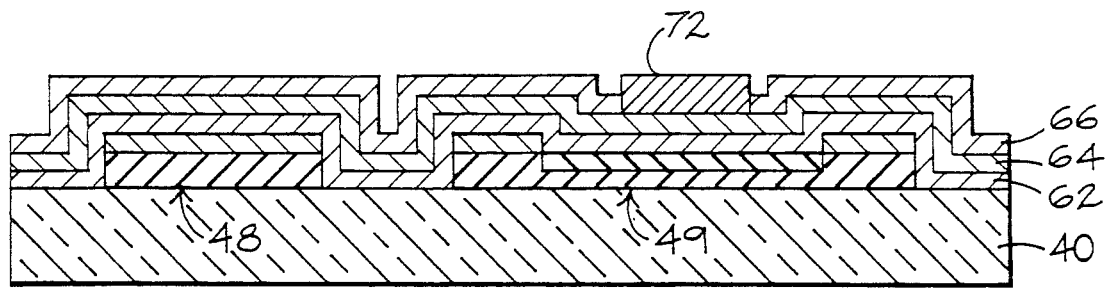
Figure 26:
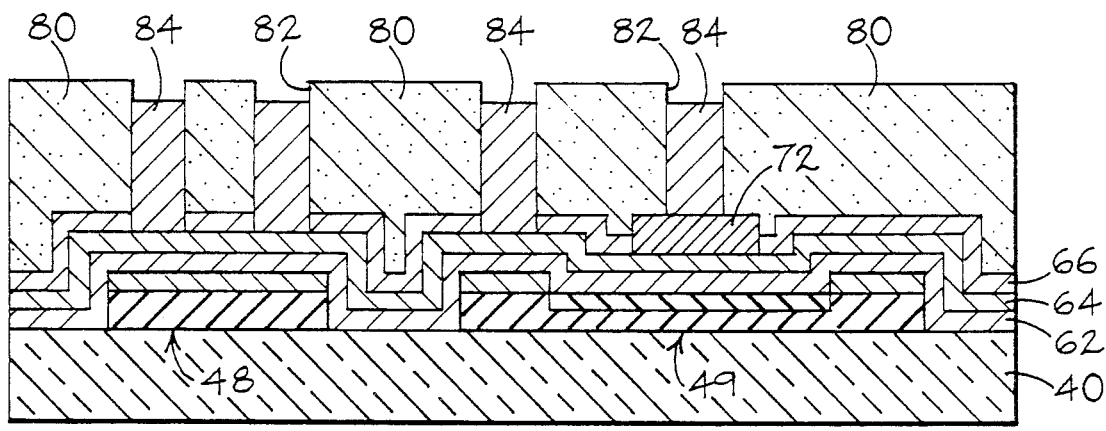

As best seen in FIG. 25, the mask 70 (or 50) has been stripped and in FIG. 26 a fourth photoresist pillar mask 80 is applied to the structure of FIG. 25, but leaving openings for pillar vias from the resistor 48 as well as electrodes 49 and 72 of the capacitor. The top layer of titanium in layer 66 is etched from the bottom of the pillar via openings 82. A suitable electrically conductive pillar 84, such as copper or nickel, is deposited such as by electroplating into the openings 82 on the copper layer 64 in the case of the resistor 48, and lower electrode 49, and on the upper electrode 72 in the case of the capacitor. Thereafter, the photoresist mask 80 is stripped to provide the structure shown in FIG. 27. Optionally, but preferably, a protective nickel coating (not shown) can be electroplated onto pillars 84. Next, interconnect layers 62, 64 and 66 which are exposed (not under one of the electrical connection pillars 84) are etched as previously described to prevent shorting between electrical connections.

Figure 28:
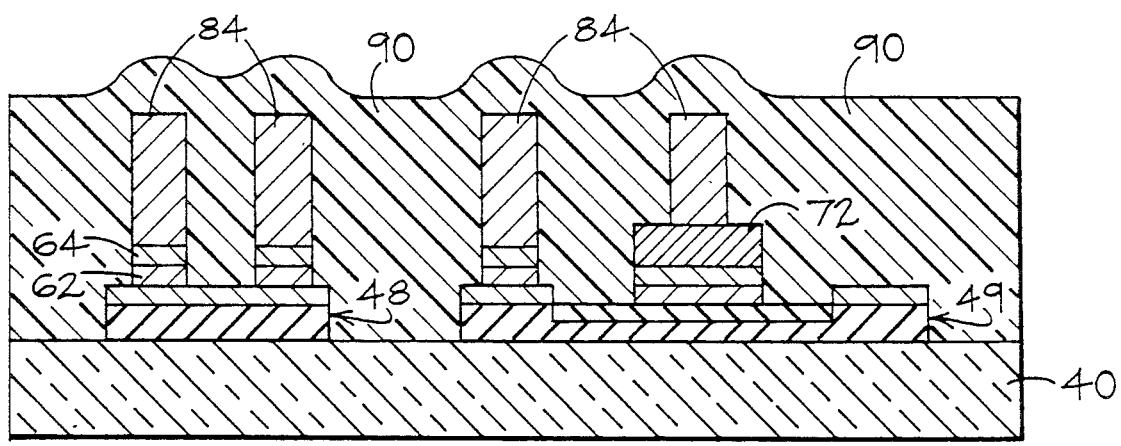
Figure 29:
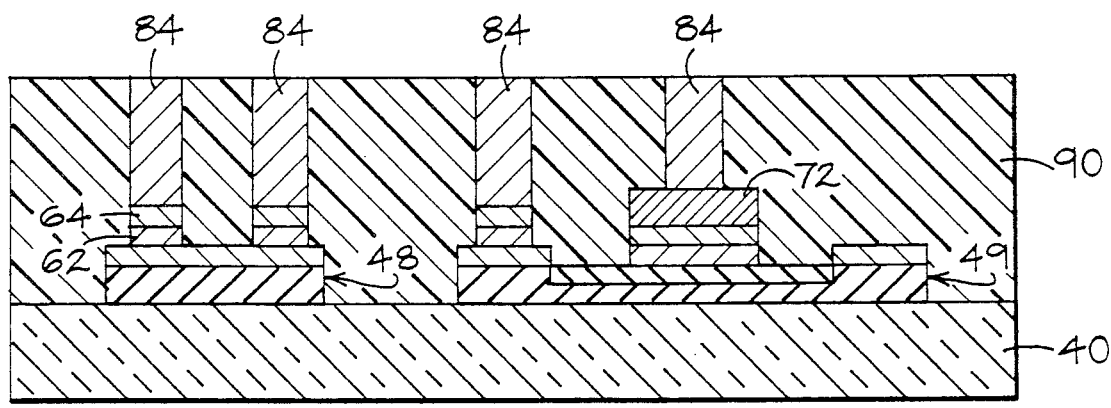
Figure 30:
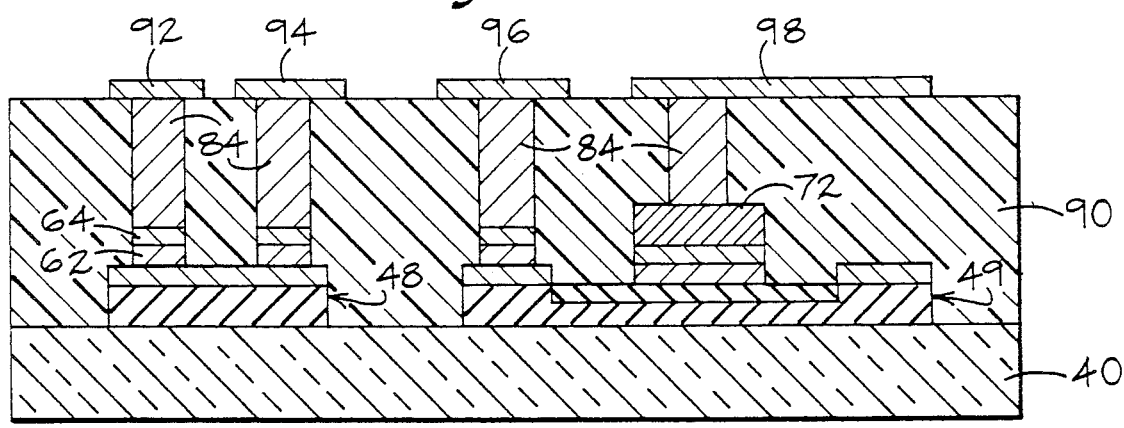

In order to finish the module, in FIG. 28 a dielectric layer, for instance polyimide 90, is deposited such as by spin coating onto the structure. In FIG. 29 the upper surface of polyimide 90 is mechanically polished to expose the via pillars 84 for connection to other structures. In FIG. 30 electrical connections 92 and 94 are connected to via pillars 84 from resistor 48 and electrical connections 96 and 98 are connected to the capacitor electrodes 49 and 72, respectively, by separate via pillars 84.

The present invention, therefore, is well adapted to carry out the objects and attain the ends and advantages mentioned, as well as others inherent therein. While presently preferred embodiments of the invention have been described for the purpose of disclosure, numerous changes in the details of construction, and steps of the process, will be readily apparent to those skilled in the art and which are encompassed within the spirit of the present invention and the scope of the appended claims.

What is claimed is:

1. A method of making an integrated resistor and capacitor in a substrate, comprising:
    applying a resistive layer over an underlying substrate;
    applying an electrically conductive layer over the resistive layer;
    applying a first mask over selected portions of the conductive layer for defining the resistor and a bottom electrode of the capacitor leaving other portions of the layers uncovered;
    etching away the uncovered portions of the conductive and resistive layers to form a resistor and a bottom electrode;
    removing the first mask;
    applying a second mask covering the resistor but leaving a portion of the conductive layer over the bottom electrode uncovered;
    etching the uncovered conductive layer;
    removing the second mask;
    oxidizing the top of the bottom electrode to form an insulator for the capacitor using the unetched conductive layer as a mask;
    applying a third mask leaving a portion of the insulator uncovered;
    applying a second conductive layer to the insulator forming an upper electrode of the capacitor;
    removing the third mask;
    applying a fourth mask leaving openings for via pillars from the resistor and from the electrodes;
    applying conductive via pillars in the openings to the resistor and to the electrodes;
    stripping the fourth mask; and
    stripping any conductive layer between the via pillars down to the resistive layer.

2. The method of claim 1 wherein the third mask is the same as the second mask.

3. The method of claim 1 wherein in the step of etching the uncovered conductive layer the conductive layer is etched back under the second mask.

4. The method of claim 1 including applying a layer of polyimide up to the top of the via pillars after stripping any conductive layer between the via pillars.

5. The method of claim 1, further comprising
    applying a metal plating layer over the top of the bottom electrode and the resistor after the bottom electrode is oxidized but before applying the third mask, and
    applying the conductive via pillars by electroplating.

6. A method of making an integrated resistor and capacitor in a substrate, comprising the following steps in the sequence set forth:
    applying a resistive layer over an underlying substrate;
    applying a conductive layer of titanium over the resistive layer;
    applying a first photopolymer mask over selected portions of the titanium layer for defining the resistor and a bottom electrode of the capacitor leaving other portions of the titanium uncovered;
    etching away the uncovered portions of the titanium and resistive layer to form a resistor and a bottom electrode;
    removing the first mask;
    applying a second mask covering the resistor, but leaving a portion of the titanium layer over the bottom electrode uncovered;
    etching the uncovered titanium layer including etching back the titanium layer from the edge of the second mask;
    removing the second mask;

oxidizing the top of the bottom electrode to form an insulator for the capacitor using the unetched titanium layer as a mask;

reapplying the second mask leaving a portion of the insulator uncovered;

applying a conductive layer to the insulator forming an upper electrode of the capacitor;

again removing the second mask;

applying a third mask leaving openings for via pillars from the resistor and from the electrodes;

applying conductive via pillars in the openings to the resistor and to the electrode;

removing the third mask; and stripping the titanium layer between the via pillars down to the resistive layer.

7. The method of claim 6 including after oxidizing the top of the bottom electrode, applying in series upwardly a first electrically conductive adhesive layer, a first electrically conductive layer, and a second adhesive layer.

8. The method of claim 6, further comprising applying a metal plating layer over the top of the bottom electrode and the resistor after the bottom electrode is oxidized but before reapplying the second mask;

applying the conductive via pillars by electroplating; and stripping the metal plating layer between the via pillars.

9. A method of making an integrated capacitor in a substrate, comprising the following steps in the sequence set forth:

applying a resistive layer over an underlying substrate;

applying an electrically conductive layer over the resistive layer;

applying a first mask over selected portions of the conductive layer for defining a bottom electrode of the capacitor leaving other portions of the layers uncovered;

etching away the uncovered portions of the conductive and resistive layers to form a bottom electrode;

removing the first mask;

applying a second mask leaving a portion of the conductive layer over the bottom electrode uncovered;

etching the uncovered conductive layer;

removing the second mask;

oxidizing the top of the bottom electrode to form an insulator for the capacitor using the unetched conductive layer as a mask, applying a third mask leaving a portion of the insulator uncovered;

applying a second conductive layer to the insulator forming an upper electrode of the capacitor;

removing the third mask;

applying a fourth mask leaving openings for via pillars from the electrodes;

applying conductive via pillars in the openings to the electrodes;

removing the fourth mask; and stripping any conductive layer between the via pillars down to the resistive layer.

10. The method of claim 9 wherein the third mask is the same as the second mask.

11. The method of claim 9 wherein in the step of etching the uncovered conductive layer the conductive layer is etched back under the second mask.

12. The method of claim 9 including applying a layer of polymer up to the top of the via pillars after stripping any conductive layer between the via pillars.

13. The method of claim 9, further comprising applying a metal plating layer over the top of the bottom electrode after the bottom electrode is oxidized but before applying the third mask; and applying the conductive via pillars by electroplating.

14. A method of making an integrated capacitor in a substrate, comprising:

applying a resistive layer over an underlying substrate;

applying a conductive layer of titanium over the resistive layer;

applying a first photopolymer mask over selected portions of the titanium layer for defining a bottom electrode of the capacitor leaving other portions of the titanium uncovered;

etching away the uncovered portions of the titanium and resistive layer to form a bottom electrode;

removing the first mask;

applying a second mask leaving a portion of the titanium layer over the bottom electrode uncovered;

etching the uncovered titanium layer including etching back the titanium layer from the edge of the second mask;

removing the second mask;

oxidizing the top of the bottom electrode to form an insulator for the capacitor using the unetched titanium layer as a mask;

reapplying the second mask leaving a portion of the insulator uncovered;

applying a conductive layer to the insulator forming an upper electrode of the capacitor;

again removing the second mask;

applying a third mask leaving openings for via pillars from the electrodes;

applying conductive via pillars in the openings to the electrodes;

removing the third mask; and stripping the titanium layer between the via pillars.

15. The method of claim 14, including after oxidizing the top of the bottom electrode, applying in series upwardly a first adhesive layer, a first electrically conductive layer, and a second adhesive layer.

16. The method of claim 14, further comprising applying a metal plating layer over the top of the bottom electrode after the bottom electrode is oxidized but before reapplying the second mask;

applying the conductive via pillars by electroplating; and stripping the metal plating layer between the via pillars.

* * * * *

UNITED STATES PATENT AND TRADEMARK OFFICE
CERTIFICATE OF CORRECTION

PATENT NO. : 5,120,572
DATED      : June 9, 1992
INVENTOR(S) : Kumar

It is certified that error appears in the above-indentified patent and that said Letters Patent is hereby corrected as shown below:

Abstract, line 3, change "connected" to -- converted --.

Column 2, line 27, delete the second instance of "the".

Column 3, line 44, "25" is not boldface.

Figure 27:
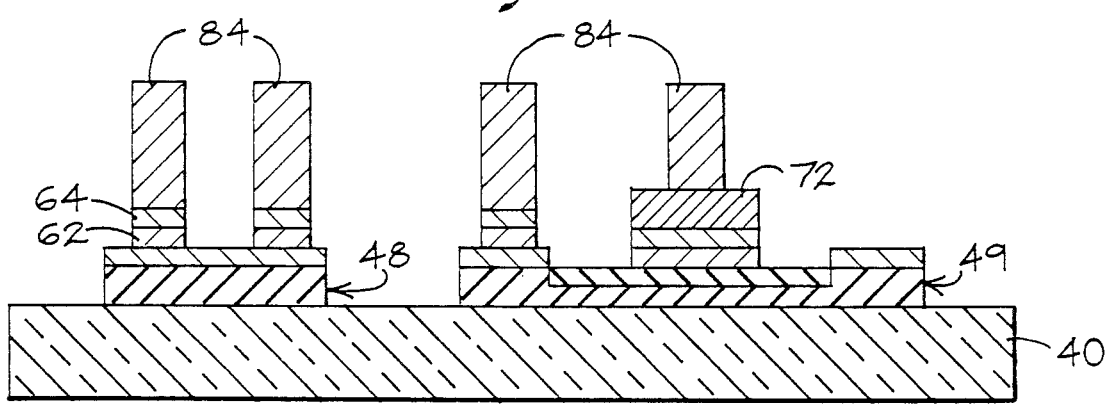

Column 5, line 37, insert -- in FIG. 27, -- after "Thereafter".

Column 5, line 38, delete "to provide the structure shown in FIG. 27."

Column 5, line 40, change "Next," to -- In addition, conductive layer 44 and --.

Column 5, line 42, insert -- or upper electrode 72 -- after "84".

Signed and Sealed this

Twenty-second Day of March, 1994

Attest:

BRUCE LEHMAN

*Attesting Officer*      *Commissioner of Patents and Trademarks*